US009576723B2

(12) United States Patent
MacLennan et al.

(10) Patent No.: US 9,576,723 B2
(45) Date of Patent: Feb. 21, 2017

(54) INSULATING SUPPORT FLANGE FOR CURRENT LOOP SYSTEM

(71) Applicant: ROCKWELL AUTOMATION TECHNOLOGIES, INC., Mayfield Heights, OH (US)

(72) Inventors: David Scott MacLennan, Ayr (CA); Mariana Wentzell, Kitchener (CA)

(73) Assignee: ROCKWELL AUTOMATION TECHNOLOGIES, INC., Mayfield Heights, OH (US)

( * ) Notice: Subject to any disclaimer, the term of this patent is extended or adjusted under 35 U.S.C. 154(b) by 215 days.

(21) Appl. No.: 14/590,696

(22) Filed: Jan. 6, 2015

(65) Prior Publication Data
US 2015/0116066 A1  Apr. 30, 2015

Related U.S. Application Data

(62) Division of application No. 13/035,560, filed on Feb. 25, 2011, now Pat. No. 8,952,275.

(51) Int. Cl.
*H02G 3/22* (2006.01)
*H01F 27/32* (2006.01)
(Continued)

(52) U.S. Cl.
CPC ............ *H01F 27/324* (2013.01); *H01F 27/06* (2013.01); *H01F 38/28* (2013.01); *Y10T 16/05* (2015.01)

(58) Field of Classification Search
CPC ........ H01F 27/324; H01F 27/06; H01F 38/28; H01F 27/32; H01F 27/30; Y10T 16/05; H02G 3/22; H02G 3/24; H02G 3/30; H02G 3/36; H02G 15/00
(Continued)

(56) References Cited

U.S. PATENT DOCUMENTS

| 4,202,998 A | 5/1980 | Cronin |
| 5,796,599 A | 8/1998 | Raonic et al. |

(Continued)

FOREIGN PATENT DOCUMENTS

CN      101326595 A    12/2008

*Primary Examiner* — Angel R Estrada
(74) *Attorney, Agent, or Firm* — Fletcher Yoder P.C.

(57) ABSTRACT

The present invention relates generally to systems and methods for isolating a current loop conductor of a current loop system of a pre-charge circuit from a plurality of current transformers disposed around the current loop conductor. In particular, the embodiments described herein include an insulating support flange having a first tubular section, a second tubular section radially disposed around the first tubular section and connected to the first tubular section via a solid annular section extending radially outward from the first tubular section to a first end of the second tubular section, an annular base extending radially outward from a second end of the second tubular section, and a plurality of prongs extending axially from or near to an outer circumference of the annular base, wherein each of the prongs comprises an end face that is angled toward the second tubular section. The insulating support flanges are configured to mate with each other along an axial direction of the current loop conductor. In addition, each of the plurality of current transformers is installed (i.e., held in place) between the prongs, annular base, and second annular section of its respective insulating support flange. As such, a fixed open air space between the first and second annular sections of the insulating support flanges isolates the current transformers from the current loop conductor, thereby reducing the possibility of discharge between the current transformers and the current loop conductor.

20 Claims, 5 Drawing Sheets

(51) Int. Cl.
*H01F 27/06* (2006.01)
*H01F 38/28* (2006.01)

(58) Field of Classification Search
USPC   174/650, 152 G, 153 G, 152 R, 135, 137 R,
174/142, 660, 17 VA; 16/2.1, 2.2; 248/56;
277/602, 590, 605; 439/274, 275, 271,
439/587
See application file for complete search history.

(56) References Cited

U.S. PATENT DOCUMENTS

| | | |
|---|---|---|
| 6,088,875 A | 7/2000 | Ono et al. |
| 6,297,457 B1 | 10/2001 | Yamada et al. |
| 6,637,070 B2 | 10/2003 | Katayama et al. |
| 6,680,437 B2 | 1/2004 | Sato |
| 6,708,366 B2 | 3/2004 | Ono et al. |
| 6,951,987 B1 * | 10/2005 | Hansen .................. H02G 15/24 174/137 R |
| 7,576,451 B2 | 8/2009 | MacLennan et al. |

\* cited by examiner

INSULATING SUPPORT FLANGE FOR CURRENT LOOP SYSTEM

CROSS REFERENCE TO RELATED APPLICATIONS

This application is a Divisional patent application from U.S. patent application Ser. No. 13/035,560, entitled "Insulating Support Flange for Current Loop System", filed Feb. 25, 2011, which is herein incorporated by reference in its entirety for all purposes.

BACKGROUND

The invention relates generally to the field of power control systems. More specifically, the invention relates to an insulating support flange for eliminating partial discharge in a current loop system.

Motor controllers, and more generally, electrical controllers operate by limiting the power from a power supply that reaches a motor or other load. For example, some motor controllers limit the power delivered to a motor by intermittently conducting current between the power supply and the motor. These motor controllers typically couple to a sinusoidal alternating current (AC) power supply and conduct current during a portion of each cycle of the sinusoid. Correspondingly, to limit the power delivered to the motor, the motor controller may not conduct current during a portion of each cycle. Typically, the duration of the period during which the motor controller does not conduct current is adjustable. Consequently, by adjusting the duration of this non-conductive period, the operation of the motor may be controlled.

Some motor controllers selectively transmit power by conducting current through a pair of silicon controlled rectifiers (SCRs). An SCR is a type of solid state switch that includes a rectifier controlled by a gate signal. Thus, when turned on by the gate signal, the SCR permits current to flow from its anode to its cathode but not in the reverse direction. Once turned on, the SCR typically remains on until the gate signal is removed and the current decreases to near zero. In the off state, the SCR usually does not conduct current in either direction. By applying a gate signal at the appropriate times, a motor controller may regulate the power delivered to a load.

Typically, a motor controller includes circuitry for turning on the SCRs. A motor controller may include a driver that delivers a small current to the gate electrode of an SCR. The driver may time the pulse of current to the gate electrode to regulate the power delivered to the motor. To deliver more power, the driver will delay for less time after an SCR becomes forward biased before turning on the SCR. Similarly, to reduce the power delivered to the motor, the driver will delay a longer period after an SCR becomes forward biased before turning on the SCR and permitting current to pass. Each driver includes circuitry for determining when to turn on the SCR. Typically, motor controllers employ one driver for each SCR. Thus, a motor controller regulating a single phase of AC power typically employs two drivers, whereas a three phase controller includes six.

Powering the operation of the drivers presents challenges. Often, the drivers connect to an SCR that is exposed to high voltages. For example, SCRs often connect to power supplies that operate at 2300 volts or higher. Thus, it may be important to keep the driver electrically isolated from other parts of the system. Some systems employ a single power supply for each driver. However, dedicated power supplies for each driver may add to system costs, the size of the system, and the number of components that may fail. Moreover, motor controllers often employ a large number of drivers. For example, as noted above, a motor controller that regulates power from a three phase AC power supply may employ six drivers, one for each of the two SCRs for each phase. Similarly, to regulate the power from higher voltage power supplies, a motor controller may employ two or more pairs of SCRs for each phase. Thus, a three phase system with three SCR pairs for each phase may employ 18 SCRs and 18 drivers. Consequently, powering each driver with a dedicated power supply becomes less desirable as the number of switches and drivers increases.

With some success, designers turned to self-powered gate driver systems (SPGDSs) to avoid these issues. Typically, SPGDSs capture energy from the power supply driving the load (i.e., line power). Often, within an SPGDS, a series of capacitors connect to self-powered circuitry that charges the capacitors. The SPGDS may exploit voltage differentials across the SCRs to draw current and store a charge. The charge on the capacitors can then be used to power the drivers. The voltage differentials exploited to charge the capacitors typically occur during the operation of the SCRs. As the SCRs intermittently conduct current between the power source and load, a voltage differential may form across the SCRs. A self-powered system may avoid the isolation issues associated with dedicated power supplies for each driver. Also, the cost of the components directed toward powering the drivers may be lower in a self-powered system than in a system employing dedicated power supplies for each driver. However, SPGDSs are in need of improvement because it is now recognized that SPGDSs are associated with delays in operation and response time.

BRIEF DESCRIPTION

The present invention relates generally to systems and methods for isolating a current loop conductor of a current loop system of a pre-charge circuit from a plurality of current transformers disposed around the current loop conductor. In particular, the embodiments described herein include an insulating support flange having a first tubular section, a second tubular section radially disposed around the first tubular section and connected to the first tubular section via a solid annular section extending radially outward from the first tubular section to a first end of the second tubular section, an annular base extending radially outward from a second end of the second tubular section, and a plurality of prongs extending axially from or near to an outer circumference of the annular base, wherein each of the prongs comprises an end face that is angled toward the second tubular section. The insulating support flanges are configured to mate with each other along an axial direction of the current loop conductor. In addition, each of the plurality of current transformers is installed (i.e., held in place) between the prongs, annular base, and second annular section of its respective insulating support flange. As such, a fixed open air space between the first and second annular sections of the insulating support flanges isolates the current transformers from the current loop conductor, thereby reducing the possibility of discharge between the current transformers and the current loop conductor.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

As described above, SPGDSs capture energy from a power supply driving a load using a series of capacitors connected to self-powered circuitry. More specifically, the SPGDSs draw current and store charge through voltage differentials across SCRs. The stored charge may then be used to power drivers of the SPGDSs. However, as also described above, SPGDSs are in need of improvement because it is now recognized that SPGDSs are associated with delays in operation and response time. When transitioning from certain modes of operation, the capacitors may lack enough charge to power the drivers. Consequently, a re-activated SPGDS may exhibit a delay before conducting current as the capacitors charge over a few cycles. For example, during full speed operation, some systems bypass the SCRs to deliver power directly from the power supply to the motor. Without a voltage differential across the SCRs, the capacitors may discharge, leaving the drivers without a source of power. Thus, when such a system transitions from full speed operation to a mode where the SPGDS limits the power delivered to the motor, the capacitors powering the driver may lack sufficient charge to restart the driver. The SCRs may remain off for a number of cycles while the capacitors build up a charge sufficient to power the drivers. Similarly, during system startup, the capacitors may have discharged due to a lack of potential across the SCRs. Consequently, during a transition from one of these periods of inactivity, the system may not respond for a few cycles as the capacitors recharge. During this delay, the SCRs may remain off, resulting in an abrupt transition in the power reaching the motor. These sudden transitions may lead to current and torque surges that could contribute to wear on various components within the system.

Figure 1:
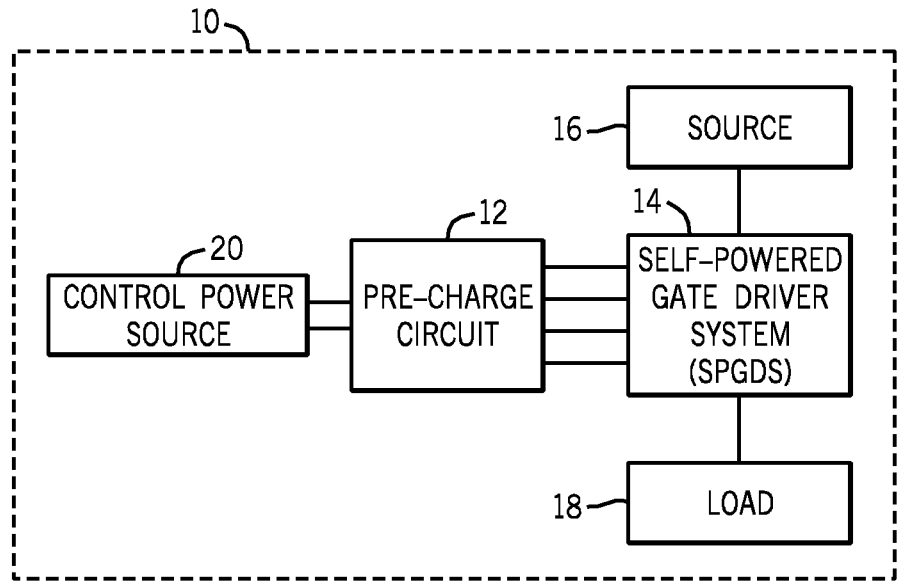
FIG. 1 is a diagrammatical view of an exemplary automation system including an SPGDS that receives a charge from a pre-charge circuit.

Turning now to the drawings, FIG. 1 depicts an exemplary automation system 10 in accordance with the present techniques. As described in greater detail below, the automation system 10 may include insulating support flanges for minimizing electrical discharge. The automation system 10 of FIG. 1 may exemplify any number of systems controlling the operation of a load. In one instance, the automation system 10 may exemplify systems employing alternating current to alternating current (AC-to-AC) motor control, such as automation systems directed toward pumping fluids, operating conveyor belts, air and gas handling, or other forms of factory automation, for example.

The automation system 10 may include a pre-charge circuit 12 to maintain a self-powered gate driver system (SPGDS) 14 in a ready state. During periods of inactivity, when energy stored within the SPGDS 14 might otherwise dissipate, the pre-charge circuit 12 may deliver a small current to keep the SPGDS 14 ready to respond without a charge-up delay when re-activated. Certain embodiments of a single pre-charge circuit 12 may deliver a current sufficient to maintain an SPGDS 14 with two drivers in a ready state. Indeed, a single pre-charge circuit 12 may deliver current sufficient to maintain multiple SPGDSs 14 in a ready state.

One or more SPGDSs 14 may connect to the pre-charge circuit 12. The SPGDS 14 may include some energy storage device to receive energy from the pre-charge circuit 12, such as a capacitor, inductor, or battery, for example. Additionally, the SPGDS 14 may include self-powered circuitry to capture energy as the SPGDS 14 operates and to charge the energy storage device. For example, the self-powered circuitry may exploit voltage differentials across the SPGDS 14 to charge a capacitor. To control a current passing through the SPGDS 14, it may include a device of variable conductance, such as a thyristor, silicon controlled rectifier, metal oxide semiconductor gated thyristor, thyratron, transistor, gate turn off thyristor, insulated gate bipolar transistor, metal oxide semiconductor field effect transistor, field controlled diodes, junction field effect transistors, static induction transistor, or bipolar junction transistor, for example.

The SPGDS 14, when active, may control the current between a source 16 and a load 18. The source 16 may include various sources of electrical energy, such as an alternating current (AC) or direct current (DC) power supply, for example. In the case of an AC power supply, the current driven by the source 16 alternates directionally in a sinusoidal manner, as a square wave, as a triangle wave, in an irregular fashion, or in any other form of alternating current. The load 18 may include any device adapted to harness the current driven by the source 16. For example, the load 18 may include an electric induction motor, a heating element, an electrochemical process, or an electric arc, for example. The SPGDS 14 may control the operation of the load 18 by selectively permitting current to flow between the source 16 and the load 18.

To draw power, the pre-charge circuit 12 is coupled to a control power source 20. The control power source 20 may be any AC power source with sufficient capacity to enable the pre-charge circuit 12 to energize the SPGDS 14. For example, to reduce costs, the control power source 20 may be a simple line frequency source, such as a 60 Hz, 120 volt AC source as is commonly available in North America or a 50 Hz, 220 volt AC source as is commonly available in Europe. However, control power sources 20 operating at other voltages and frequencies may also be employed. Because the demands placed on the control power source 20 by the pre-charge circuit 12 may be much smaller than the demands placed on the source 16 by the load 18, the root mean square (RMS) voltage supplied by the control power source 20 may be much smaller than the RMS voltage supplied by the source 16. For example, the RMS voltage of the control power source 20 may be smaller than one half or smaller than one tenth of the RMS voltage of the source 16.

In operation, the pre-charge circuit 12 may continuously deliver a small charge to the SPGDS 14, ensuring the components within the SPGDS 14 that power its operation maintain sufficient reserves of stored electrical energy to re-start the SPGDS 14 without delay. When activated, the SPGDS 14 may still draw power from the pre-charge circuit 12, but the self-powered circuitry will draw the bulk of the SPGDS 14 power by exploiting voltage differentials generated as the SPGDS 14 intermittently blocks current flow between the source 16 and the load 18. However, it should be noted that applications of the present technique are not limited to pre-charge circuits 12 which continuously charge the SPGDS 14, as the pre-charge circuit 12 may operate intermittently in some embodiments. When the SPGDS 14 is inactive, the charge provided by the pre-charge circuit 12 may prevent the components powering the SPGDS 14 from becoming de-energized. The pre-charge circuit 12 may transmit power from the control power source 20 to the SPGDS 14 while keeping the SPGDS 14 electrically isolated. Electrical isolation may be important because the SPGDS 14 may experience voltages from the source 16 and load 18 that are much larger than the peak voltage of the control power source 20. Thus, the pre-charge circuit 12 may keep the SPGDS 14 isolated.

Figure 2:
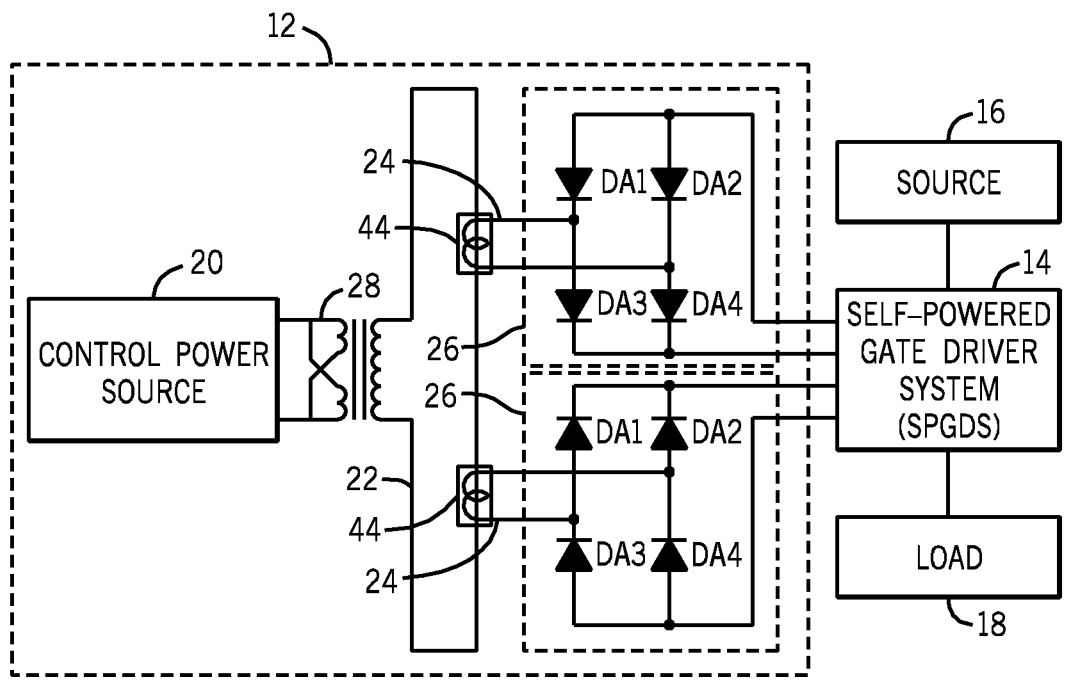
FIG. 2 is a more detailed diagrammatical view of the automation system of FIG. 1 with a circuit diagram of the pre-charge circuit of FIG. 1.

To illustrate the pre-charge circuit 12 in more detail, FIG. 2 depicts a circuit diagram of an exemplary pre-charge circuit 12 included within an automation system 10. To prevent current from flowing between the SPGDS 14 and the control power source 20, the pre-charge circuit 12 may include an insulated current loop 22 that passes through one or more coils 24. The current loop 22 may be a wire of sufficient length to extend through the coils 24. Due to their proximity, an alternating current passed through the current loop 22 induces a current in the coils 24. This induced current may be harnessed to maintain a charge in the SPGDS 14. As illustrated in FIG. 2 and described in greater detail below, the pre-charge circuit 12 may include one or more insulating support flanges 44 configured to minimize discharge between the current loop 22 and the coils 24.

One or more bridge rectifiers 26 may rectify alternating currents induced in the coils 24. The bridge rectifiers 26 are disposed between the SPGDS 14 and the coils 24 respectively. The bridge rectifiers 26 convert an alternating current within the coils 24 into a unidirectional current that may be employed to charge storage capacitors within the SPGDS 14. The bridge rectifiers 26 may, for example, include four diodes (e.g., DA1-DA4) in bridge arrangement to achieve full-wafer rectification. However, it should be noted that other embodiments may employ other devices to rectify the current from the coils 24, such as a half wave rectifier, for example.

In certain embodiments, the pre-charge circuit 12 may include a transformer 28 to step down the voltage from the control power source 20, as the impedance of the current loop 22 may be very low. The transformer 28 may be a simple line transformer adapted to step the voltage from the control power source 20 down to 0.6 volts, for example. However, other embodiments may employ transformers 28 outputting different voltages. By employing a current loop 22, the output of a single transformer 28 may be harnessed to power a plurality of drivers within a plurality of SPGDSs 14. By adding coil loops 24 to the pre-charge circuit 12, a single transformer 28 may support additional SPGDSs 14 and their associated drivers.

The length and gauge of the current loop 22 may be important to ensure sufficient current is induced in the coils 24. In some embodiments, the current loop 22 employs between number 4 and number 8 gauge wire that is between 10 and 30 feet in length. For example, certain embodiments may employ a 21 foot long current loop 22 of number 6 gauge wire. A current loop 22 of these dimensions coupled to a transformer 28 outputting 0.6 volt alternating current may carry approximately 50 amperes of alternating current within the current loop 22. The coils 24 disposed around this current loop 22 may include an appropriate number of windings to energize the capacitors within the SPGDS 14 during periods of inactivity.

Figure 3:
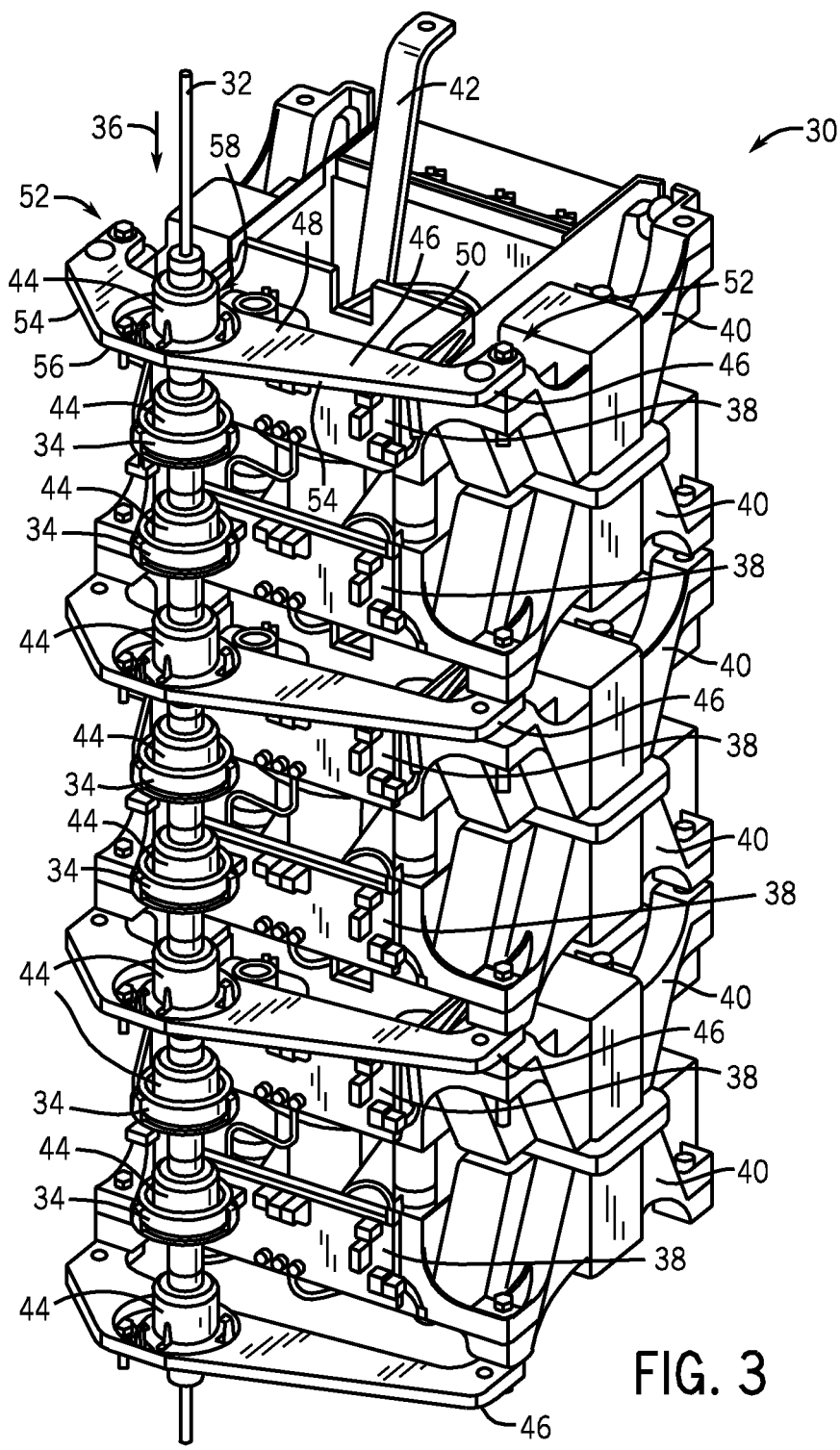
FIG. 3 is a perspective view of an exemplary current loop system for implementing the pre-charge circuit of FIGS. 1 and 2.

FIG. 3 is a perspective view of an exemplary current loop system 30 for implementing the pre-charge circuit 12 of FIGS. 1 and 2. More specifically, as illustrated in FIG. 3, the current loop system 30 includes a current loop conductor 32 (e.g., shaped as a long rod in FIG. 3), which operates as the current loop 22 of the pre-charge circuit 12 of FIG. 2. In addition, the current loop system 30 includes a plurality of current transformers 34, each having a toroidal magnetic core body disposed around the current loop conductor 32. The coils 24 described above with respect to FIG. 2 are wrapped around the toroidal magnetic core body of the current transformers 34. As described above, alternating current flowing axially through the current loop conductor 32, as illustrated by arrow 36, induces a current in the coils 24 wrapped around the toroidal magnetic core body of the current transformers 34.

The alternating current flowing through the coils 24 of the current transformers 34 may be used to charge the SPGDS 14 of FIGS. 1 and 2 during periods of inactivity. More specifically, the SPGDSs 14 described above with respect to FIGS. 1 and 2 include the gate driver boards 38 depicted in FIG. 3. As illustrated, each gate driver board 38 is electrically coupled to a respective power brick 40, which are in series and electrically coupled to the load 18 described above with respect to FIGS. 1 and 2 via a main line terminal 42. As such, the alternating current flowing through the coils 24 of the current transformers 34 may be used to charge the gate driver boards 38 during periods of inactivity. At the same time, current may not flow from the gate driver boards 38, which regulate high voltage power, back to the current loop conductor 32 (i.e., the current loop 22 of FIG. 2), which may operate at much lower voltages.

In certain embodiments, the current loop conductor 32 may include a conductive core with a layer of insulation having a sufficient thickness and dielectric strength to prevent current from flowing from the coils 24 to ground. For example, the insulation layer may include a layer of silicon rated at 50 kV of DC power. However, it should be noted that other embodiments may employ other insulators, such as polytetrafluoroethylene, glass braid, ceramic fiber, polyethylene, polypropylene, or any other material with a sufficient dielectric strength.

In addition, the current loop system 30 includes a plurality of insulating support flanges 44 disposed around the current loop conductor 32 to further isolate the current loop conductor 32 from the coils 24 of the current transformers 34. In particular, as described in greater detail below, each insulating support flange 44 includes a central tubular body having an open air insulating space between first and second annular sections, and a plurality of prongs extending from a circular base. The current transformers 34 may be snapped into place between the central tubular body and the plurality of prongs extending from the circular base. In addition, the central tubular bodies of the insulating support flanges 44 are configured to fit within other axially adjacent central tubular bodies, thereby holding the insulating support flanges 44 and associated current transformers 34 in place and equally spaced axially along the current loop conductor 32.

The insulating support flanges 44 may be made of a plastic (e.g., an injection molded thermoplastic), or any other electrical grade material having sufficient dielectric strength. In certain embodiments, the insulating support flanges 44 may be corrugated to increase their mechanical strength. The insulating support flanges 44 may protect softer insulators of the current loop conductor 32 from mechanical damage when installing the current loop conductor 32 through the current transformers 34. Additionally, the insulating support flanges 44 may facilitate removal and replacement of the current loop conductor 32.

In addition, as illustrated in FIG. 3, the current loop system 30 may include a plurality of flange mounting brackets 46 that may be mounted to (e.g., bolted to) the power bricks 40. More specifically, the flange mounting brackets 46 may be mounted between alternating adjacent power bricks 40. In other words, in certain embodiments, the flange mounting brackets 46 may be mounted between every other adjacent pair of power bricks 40. However, in other embodiments, the spacing of the flange mounting brackets 46 between power bricks 40 may vary. For example, the flange mounting brackets 46 may be spaced between 1, 3, 4, 5, or more sets of power bricks 40. As illustrated, in certain embodiments, the flange mounting brackets 46 may include a generally triangular-shaped planar body portion 48 having a first side 50 extending between two power brick mounting points 52, and two other sides 54 extending from the power brick mounting points 52 to a common apex 56. A circular hole 58 may be cut into the planar body portion 48 of the flange mounting brackets 46 to enable the insulating support flanges 44 to be mounted within the flange mounting brackets 46. As illustrated in FIG. 3, in certain embodiments, every third insulating support flange 44 may be mounted to a flange mounting bracket 46. However, in other embodiments, the spacing of the insulating support flanges 44 between flange mounting brackets 46 may vary. For example, 2, 4, 5, 6, or more insulating support flanges 44 may be supported between flange mounting brackets 46.

Figure 4:
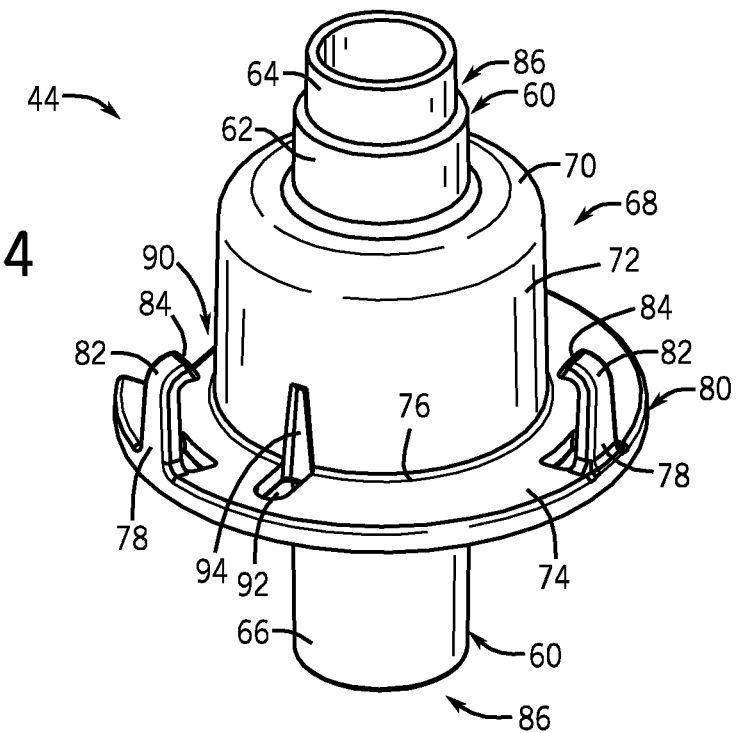
FIG. 4 is a perspective view of an exemplary insulating support flange of the current loop system of FIG. 3.

FIG. 4 is a perspective view of an exemplary insulating support flange 44 of the current loop system 30 of FIG. 3. As illustrated, the insulating support flange 44 may include a central tubular section 60, which is an annular section within which the current loop conductor 32 may be installed. The central tubular section 60 may include a main tubular section 62 having a first inner diameter, a first outer diameter, and a first thickness. The central tubular section 60 may also include an upper tubular section 64 having a second inner diameter that is substantially the same as the first inner diameter (e.g., within 5% of the first inner diameter), a second outer diameter that is smaller than the first outer diameter, and a second thickness that is smaller than the first thickness (e.g., approximately 50% of the first thickness). The central tubular section 60 may also include a lower tubular section 66 having a third inner diameter that is greater than the first and second inner diameters, a third outer diameter that is substantially the same as the first outer diameter (e.g., within 5% of the first outer diameter), and a third thickness that is smaller than the first thickness (e.g., approximately 50% of the first thickness).

In general, the upper tubular section 64 of one insulating support flange 44 is configured to fit securely within the lower tubular section 66 of another adjacent insulating support flange 44. More specifically, the second outer diameter of the upper tubular section 64 is substantially the same as (or slightly smaller than) the third inner diameter of the lower tubular section 66. In general, the main tubular section 62 is substantially longer than both the upper and lower tubular sections 64, 66. For example, in certain embodiments, the main tubular section 62 may be between approximately 3-8 times longer than both the upper and lower tubular sections 64, 66.

As also illustrated in FIG. 4, the insulating support flange 44 includes a second annular section 68 (i.e., with the central tubular section 60 being the first annular section) that is radially disposed around the central tubular section 60. In particular, as described in greater detail below, the annular section 68 includes a generally planar section 70 that forms an annular plane extending radially from the central tubular section 60, and an outer tubular section 72 that extends axially from the outer edges of the generally planar section 70 (e.g., concentric to the central tubular section 60). As such, as described in greater detail below, the central tubular section 60 and the annular section 68 form a fixed open space therebetween, which further insulates the current loop conductor 32 from the current transformers 34 during operation.

The insulating support flange 44 also includes a generally planar base 74 that forms an annular plane extending radially from an end 76 of the outer tubular section 72. In addition, the insulating support flange 44 includes a plurality of prongs 78. In certain embodiments, the prongs 78 extend from the base 74 at or near an outer circumference 80 of the base 74. However, in other embodiments, the plurality of prongs 78 may be located at other (e.g., inner) radial locations of the base 74. The embodiments described herein include three prongs 78 extending from the base 74 and substantially equally spaced circumferentially around the base 74. However, in other embodiments, 2, 4, 5, or even more prongs 78 may be used. In general, the support flange 44 is configured to couple with one of the current transformers 34, such that the current transformer 34 snaps into place between the prongs 78, the base 74, and the outer tubular section 72 with the prongs 78 holding the current transformers 34 in place. More specifically, each of the prongs 78 includes an end 82 that extends radially inward toward the outer tubular section 72 such that a transformer 34 may be held in place between the prongs 78, the base 74, and the outer tubular section 72. In addition, the end 82 includes an angled end face 84 that enables a current transformer 34 to be moved into place, with the prongs 78 giving way slightly in the radial direction.

Although not illustrated in the perspective view of FIG. 4, in certain embodiments, the insulating support flange 44 may also include a rotational locking feature configured to prevent rotation of the insulating support flange 44 relative to other adjacent insulating support flanges 44. More specifically, as described in greater detail below, the rotational locking feature may include a protrusion that extends radially outward from the upper tubular section 64 of the central tubular section 60 near an axial location 86 where the main tubular section 62 transitions into the upper tubular section 64. In addition, the rotational locking feature may also include an indention that extends radially into an inner wall of the lower tubular section 66 near a lower end 88 of the insulating support flange 44. As described in greater detail below, when adjacent insulating support flanges 44 are axially installed next to each other around the current loop conductor 32, the protrusion extending radially outward from the upper tubular section 64 of one insulating support flange 44 aligns and mates with the indention extending radially into the inner wall of the lower tubular section 66 of the adjacent insulating support flange 44. As such, rotation of the adjacent insulating support flanges 44 is substantially prevented.

In addition, in certain embodiments, the insulating support flange 44 may include a cutout section 90 near the outer circumference 80 of the base 74, which facilitates traversal of wiring (e.g., the coils 24) from the current transformer 34 that is mounted on the insulating support flange 44. In addition, in certain embodiments, the insulating support flange 44 may include one or more holes 92 through the base 74 adjacent the outer tubular section 72, and associated grooves 94 in the outer tubular section 72 adjacent the base 74. The holes 92 and grooves 94 facilitate the mounting of the insulating support flanges 44 to the flange mounting brackets 46 illustrated in FIG. 3. More specifically, bolts (not shown) may be passed through the holes 92 (with the grooves 94 providing room for the bolts if needed) such that the bolts secure the insulating support flange 44 to a flange mounting bracket 46.

Figure 5:
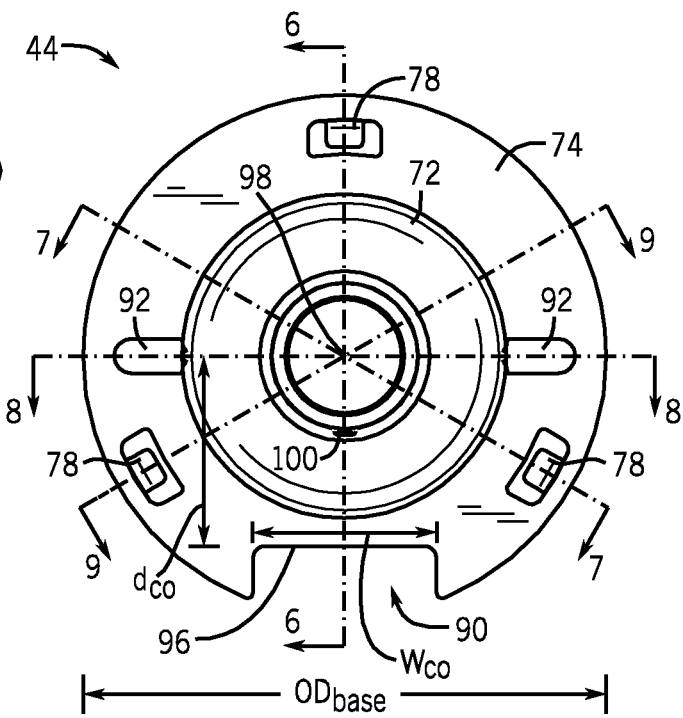
FIG. 5 is a top view of the insulating support flange of FIG. 4.

FIG. 5 is a top view of the insulating support flange 44 of FIG. 4. In addition, FIGS. 6-9 are cross-sectional side views of the insulating support flange 44 taken along lines 6-6, 7-7, 8-8, and 9-9 of FIG. 5, respectively. FIGS. 5 through 9 are intended to more fully describe features and dimensions of the insulating support flange 44. For example, in certain embodiments, the outer diameter $OD_{base}$ of the base 74 of the insulating support flange 44 may be approximately 2.9 inches (e.g., within a range of approximately 2.6-3.2 inches). As illustrated in FIG. 5, in certain embodiments, the insulating support flange 44 may include three prongs 78 that are equally spaced (i.e., 120 degrees apart) around the circumference 80 of the base 74. However, as described above, the insulating support flange 44 may instead have 2, 4, 5, or even more prongs 78 spaced around the circumference 80 of the base 74. In addition, in certain embodiments, the prongs 78 may not be equally spaced around the circumference 80 of the base 74.

As also illustrated in FIG. 5, in certain embodiments, the insulating support flange 44 may have the two holes 92 disposed on opposite sides of the outer tubular section 72 in the base 74. However, the insulating support flange 44 may instead include more than two holes 92. As described above, the holes 92 facilitate mounting of the insulating support flange 44 to a flange mounting bracket 46. As also illustrated in FIG. 5, in certain embodiments, the base 74 of the insulating support flange 44 may include the cutout section 90, which as described above facilitates traversal of wiring (e.g., the coils 24) from the current transformer 34 that is mounted on the insulating support flange 44. As illustrated, in certain embodiments, the cutout section 90 may be generally rectangular shaped, with an inner side 96 being spaced at a distance $d_{CO}$ approximately 1.05 inches (e.g., within a range of approximately 0.95-1.15 inches) from a central axis 98 of the insulating support flange 44. In addition, in certain embodiments, the inner side 96 of the generally rectangular shaped cutout section 90 may have a width $w_{CO}$ of approximately 1 inch (e.g., within a range of approximately 0.9-1.1 inches).

Figure 6:
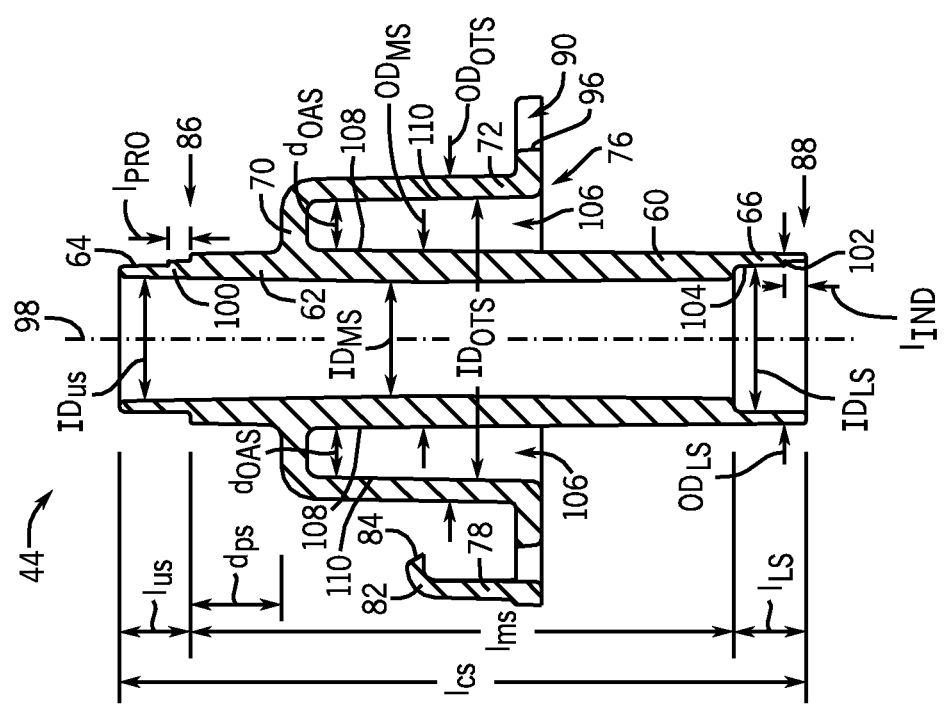
FIG. 6 is a cross-sectional side view of the insulating support flange taken along line 6-6 of FIG. 5.
Figure 8:
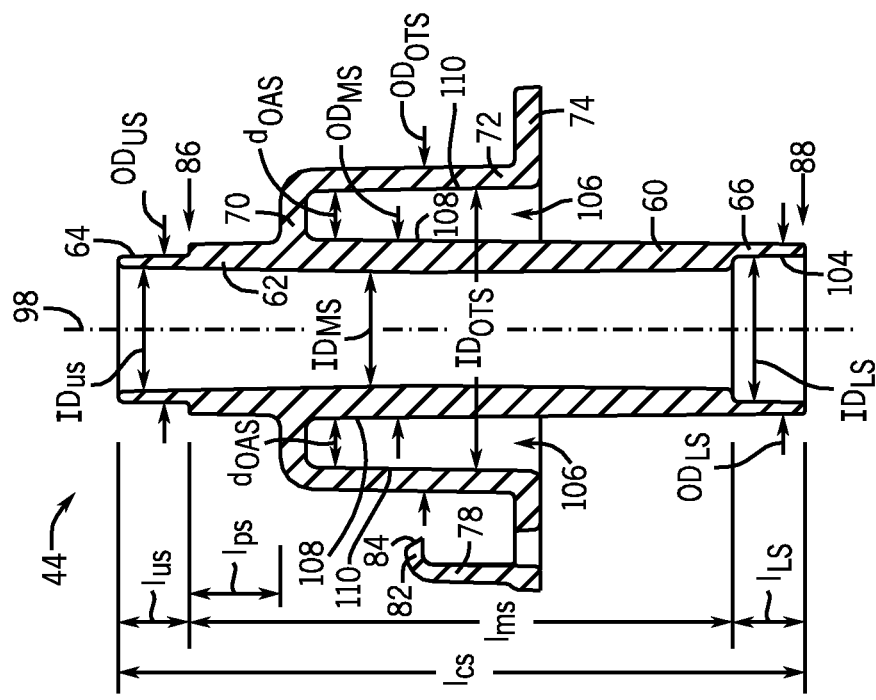
FIG. 8 is a cross-sectional side view of the insulating support flange taken along line 8-8 of FIG. 5.
Figure 9:
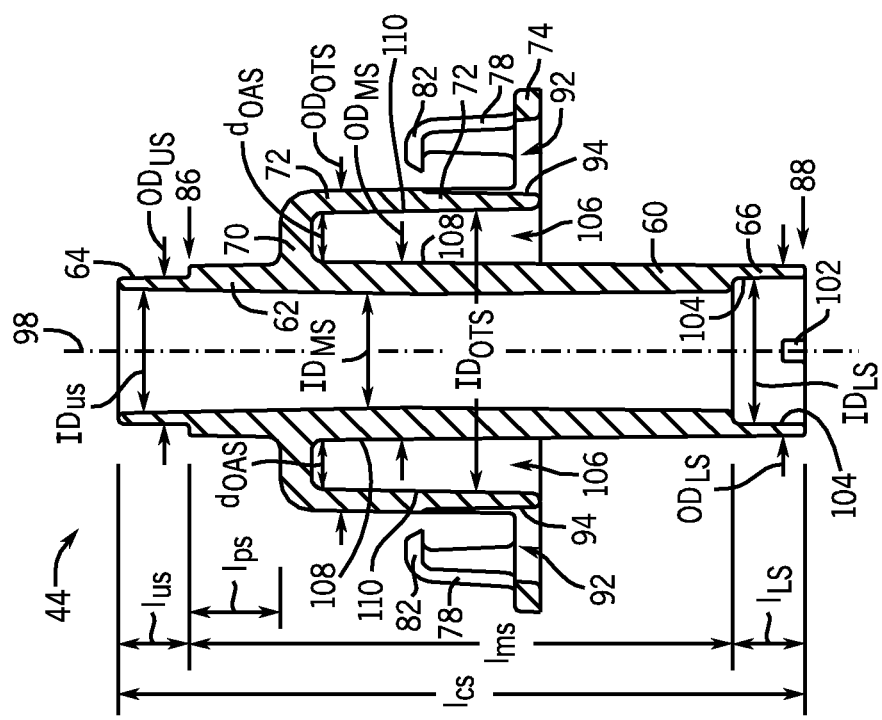
FIG. 9 is a cross-sectional side view of the insulating support flange taken along line 9-9 of FIG. 5.

FIG. 5 also illustrates a protrusion 100 that extends radially outward from the upper tubular section 64 of the central tubular section 60 near the axial location 86 where the main tubular section 62 transitions into the upper tubular section 64. FIG. 6 also illustrates the protrusion 100, as well as an indention 102 that extends radially into the inner wall 104 of the lower tubular section 66 near the lower end 88 of the insulating support flange 44. As described above, the protrusion 100 and the indention 102 together form a rotational locking feature that substantially prevents rotation of adjacent insulating support flanges 44. More specifically, when adjacent insulating support flanges 44 are axially installed next to each other around the current loop conductor 32, the protrusion 100 of one insulating support flange 44 aligns and mates with the indention 102 of an adjacent insulating support flange 44. As illustrated in FIG. 6, in certain embodiments, both the length $l_{PRO}$ of the protrusion 100 and the length $l_{IND}$ of the indention 102 may be approximately 0.12 inches (e.g., within a range of approximately 0.1-0.14). Regardless of the exact dimensions, the length $l_{IND}$ of the indention 102 may be slightly greater than the length $l_{PRO}$ of the protrusion 100 such that the protrusion 100 of one insulating support flange 44 fits within the indention 102 of an adjacent insulating support flange 44 when adjacent insulating support flanges 44 are axially installed next to each other around the current loop conductor 32.

As also illustrated in FIGS. 6 through 9, in certain embodiments, the inner diameter $ID_{US}$ of the upper tubular section 64 and the inner diameter $ID_{MS}$ of the main tubular section 62 may both be approximately 0.63 inches (e.g., within a range of approximately 0.56-0.7 inches), and the inner diameter $ID_{LS}$ of the lower tubular section 66 may be approximately 0.81 inches (e.g., within a range of approximately 0.72-0.9 inches). In addition, in certain embodiments, the outer diameter $OD_{US}$ of the upper tubular section 64 may be approximately 0.8 inches (e.g., within a range of approximately 0.72-0.9 inches), and the outer diameter $OD_{MS}$ of the main tubular section 62 and the outer diameter $OD_{LS}$ of the lower tubular section 66 may both be approximately 0.9 inches (e.g., within a range of approximately 0.8-1.0 inches). Regardless of the exact dimensions, as described above, the outer diameter $OD_{US}$ of the upper tubular section 64 will be slightly smaller than the inner diameter $ID_{LS}$ of the lower tubular section 66 such that the upper tubular section 64 of one insulating support flange 44 may fit within the lower tubular section 66 of an adjacent insulating support flange 44 when assembled around the current loop conductor 32.

As also illustrated in FIGS. 6 through 9, in certain embodiments, the length $l_{US}$ of the upper annular section 64 of the central annular section 60 may be approximately 0.4 inches (e.g., within a range of approximately 0.35-0.45), the length $l_{MS}$ of the main annular section 62 of the central annular section 60 may be approximately 3 inches (e.g., within a range of approximately 2.7-3.3), and the length $l_{LS}$ of the lower annular section 66 of the central annular section 60 may be approximately 0.4 inches (e.g., within a range of approximately 0.35-0.45). As such, the total length $l_{CS}$ of the central annular section 60 may be approximately 3.8 inches (e.g., within a range of approximately 3.4-4.2 inches). In addition, the generally planar section 70 extending from the main tubular section 62 and connecting to the outer tubular section 72 may be axially located along the main tubular section 62 by a distance $d_{PS}$ of approximately 0.5 inches (e.g., within a range of approximately 0.45-0.55 inches) from the axial location 86 where the main tubular section 62 transitions into the upper tubular section 64.

As also illustrated in FIGS. 6 through 9, in certain embodiments, the outer diameter $OD_{OTS}$ of the outer tubular section 72 may be approximately 1.77 inches (e.g., within a range of approximately 1.6-1.95 inches), and the inner diameter $ID_{OTS}$ of the outer tubular section 72 may be approximately 1.5 inches (e.g., within a range of approximately 1.35-1.65 inches). As such, the inner diameter $ID_{OTS}$ of the outer tubular section 72 may be substantially larger than the outer diameter $OD_{MS}$ of the main tubular section 62, thereby forming a fixed, open air space 106 (i.e., an annular open air volume) between the main tubular section 62 and the outer tubular section 72. For example, assuming that the outer diameter $OD_{MS}$ of the main tubular section 62 is approximately 0.9 inches and the inner diameter $ID_{OTS}$ of the outer tubular section 72 is approximately 1.5 inches, an outer wall 108 of the main tubular section 62 and an inner wall 110 of the outer tubular section 72 are separated by an open air space distance $d_{OAS}$ of approximately 0.3 inches. As such, in certain embodiments, the open air space distance $d_{OAS}$ may be greater than approximately 25% of the outer diameter $OD_{MS}$ of the main tubular section 62.

Figure 7:
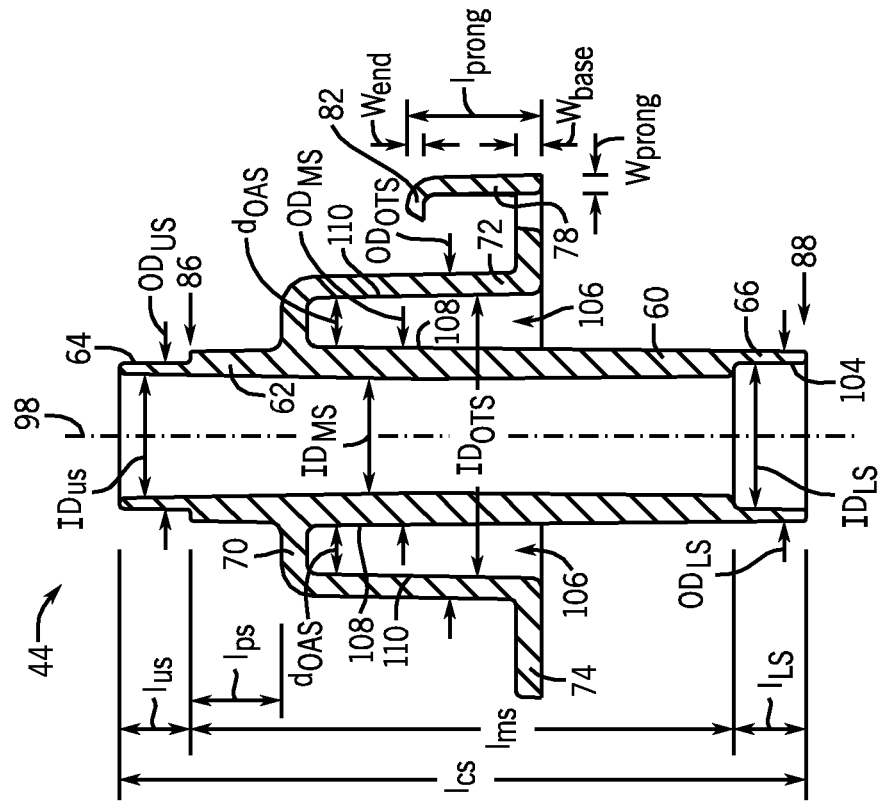
FIG. 7 is a cross-sectional side view of the insulating support flange taken along line 7-7 of FIG. 5.

As also illustrated in FIG. 7, in certain embodiments, each of the prongs 78 may have a length $l_{prong}$ of approximately 0.6 inches (e.g., within a range of approximately 0.54-0.66 inches), with the end 82 having a width $w_{end}$ of approximately 0.09 inches (e.g., within a range of approximately 0.08-0.1 inches). In addition, in certain embodiments, the prongs 78 may have a width $w_{prong}$ of approximately 0.11 inches (e.g., within a range of approximately 0.1-0.12 inches). In addition, in certain embodiments, the base 74 may have a width $w_{base}$ of approximately 0.15 inches (e.g., within a range of approximately 0.13-0.17 inches).

As described above, the insulating support flanges 44 enable isolation of the current loop conductor 32 from the current transformers 34 of FIG. 3. When using higher power system voltages (e.g., up to, or even greater than, 15 kV), insulation integrity becomes more and more important. Conventional techniques have exhibited high levels of partial discharge and low inception voltages, resulting in eventual product performance degradation, with the potential for internal arc faults. The insulating support flanges 44 described herein ensure that no solid media or trapped air pockets are in contact with either the current loop conductor 32 or the current transformers 34. More specifically, the fixed, open layer of air insulation (i.e., the fixed, open air space 106 between the main tubular section 62 and the outer tubular section 72) eliminates partial discharge issues present in conventional systems. In addition, the insulating support flanges 44 are designed as interlocking molded profiles, such that the insulating support flanges 44 are highly modular in nature, enhancing reusability and replaceability. As such, the embodiments described herein provide a robust, reliable, scalable, and cost effective alternative to conventional techniques.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A current loop system, comprising:
a current loop conductor rod;
a plurality of insulating support flanges disposed radially around the current loop conductor rod, wherein tubular sections of adjacent insulating support flanges mate in an axial direction along the current loop conductor rod; and
a plurality of annular current transformers, each current transformer installed in a respective insulating support flange such that the current transformer is disposed radially around the current loop conductor rod but isolated from the current loop conductor rod by its respective insulating support flange.

2. The current loop system of claim 1, wherein each insulating support flange comprises:

a first tubular section configured to mate with first tubular sections of adjacent insulating support flanges in the axial direction along the current loop conductor rod;
a second tubular section radially disposed around the first tubular section and connected to the first tubular section via a solid annular section extending radially outward from the first tubular section to a first end of the second tubular section, wherein an annular open air volume is formed between an inner wall of the second tubular section and an outer wall of the first tubular section;
an annular base extending radially outward from a second end of the second tubular section; and
a plurality of prongs extending axially from the annular base proximate an outer circumference of the annular base, wherein the respective current transformer is held in place between the plurality of prongs, the annular base, and the second tubular section.

3. The current loop system of claim 2, wherein the annular base comprises one or more holes through the annular base adjacent the second tubular section.

4. The current loop system of claim 3, wherein the annular base comprises two holes through the annular base adjacent the second tubular section and disposed on opposite sides of the second tubular section.

5. The current loop system of claim 2, wherein the annular base comprises a cutout portion near the outer circumference of the annular base.

6. The current loop system of claim 5, wherein the cutout portion comprises a generally rectangular cutout portion through the annular base.

7. The current loop system of claim 6, wherein the cutout portion extends axially through the annular base near the outer circumference of the annular base and circumferentially between two prongs.

8. The current loop system of claim 2, wherein each of the plurality of prongs comprises a distal end that extends radially toward the second tubular section.

9. The current loop system of claim 8, wherein the distal end of each of the plurality of prongs is opposite a proximal end of the respective prong, wherein the proximal end is adjacent the outer circumference of the annular base.

10. The current loop system of claim 2, wherein the plurality of prongs are substantially equally spaced around the outer circumference of the annular base.

11. The current loop system of claim 10, wherein the plurality of prongs comprise three prongs that are substantially equally spaced around the outer circumference of the annular base.

12. The current loop system of claim 2, wherein an outer diameter of the annular base is within a range of 2.6 inches and 3.2 inches, wherein a diameter of the inner wall of the second tubular section is within a range of 1.35 inches and 1.65 inches, and wherein the outer diameter of the first tubular section is within a range of 0.8 inches and 1.0 inch.

13. The current loop system of claim 2, wherein the first tubular section, the second tubular section, the annular base, and the plurality of prongs are comprised of a plastic material.

14. The current loop system of claim 2, wherein the first tubular section comprises a main tubular section having a first inner diameter and a first outer diameter, an upper tubular section extending axially from a first end of the main tubular section to a first axial end of the first tubular section, wherein the upper tubular section comprises a second inner diameter and a second outer diameter, and a lower tubular section extending axially from a second end of the main tubular section to a second axial end of the first tubular section opposite the first axial end, wherein the lower tubular section comprises a third inner diameter and a third outer diameter, wherein the second outer diameter is slightly smaller than the third inner diameter, and wherein the upper tubular sections and lower tubular sections of adjacent insulating support flanges mate in the axial direction along the current loop conductor rod.

15. The current loop system of claim 14, wherein the first inner diameter and the second inner diameter are substantially similar in size, and the first outer diameter and the third outer diameter are substantially similar in size.

16. The current loop system of claim 15, wherein the first inner diameter and the first outer diameter are substantially constant from the first end of the main tubular section to the second end of the main tubular section, wherein the second inner diameter and the second outer diameter are substantially constant from the first end of the main tubular section to the first axial end of the first tubular section, and wherein the third inner diameter and the third outer diameter are substantially constant from the second end of the main tubular section to the second axial end of the first tubular section.

17. The current loop system of claim 14, wherein the upper tubular section comprises a protrusion extending radially outward adjacent an axial location where the main tubular section and the upper tubular section abut.

18. The current loop system of claim 17, wherein the lower tubular section comprises an indention into an inner wall of the lower tubular section at the second end of first tubular section, and wherein the protrusions of the upper tubular sections and the indentions of the lower tubular sections of adjacent insulating support flanges mate.

19. The current loop system of claim 14, wherein an axial length of the main tubular section from the first end of the main tubular section to the second end of the main tubular section is within a range of 2.7 inches and 3.3 inches, wherein an axial length of the upper tubular section from the first end of the main tubular section to the first axial end of the first tubular section is within a range of 0.35 inches and 0.45 inches, and wherein an axial length of the lower tubular section from the second end of the main tubular section to the second axial end of the first tubular section is within a range of 0.35 inches and 0.45 inches.

20. The current loop system of claim 19, wherein an axial length of each of the plurality of prongs is within a range of 0.54 inches and 0.66 inches.

* * * * *